United States Patent
Tang et al.

(10) Patent No.: US 9,627,529 B1
(45) Date of Patent: Apr. 18, 2017

(54) WELL-TAP STRUCTURES FOR ANALOG MATCHING TRANSISTOR ARRAYS

(71) Applicant: Altera Corporation, San Jose, CA (US)

(72) Inventors: Yue Teng Tang, Bayan Lepas (MY); Albert Victor Kordesch, Georgetown (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/719,078

(22) Filed: May 21, 2015

(51) Int. Cl.
| | |
|---|---|
| H01L 27/00 | (2006.01) |
| H01L 29/78 | (2006.01) |
| H01L 27/06 | (2006.01) |
| H01L 29/10 | (2006.01) |
| H01L 27/02 | (2006.01) |
| H01L 27/118 | (2006.01) |
| H01L 29/66 | (2006.01) |
| H01L 21/8238 | (2006.01) |
| H01L 29/06 | (2006.01) |

(52) U.S. Cl.
CPC .. *H01L 29/7817* (2013.01); *H01L 21/823892* (2013.01); *H01L 27/0207* (2013.01); *H01L 27/0617* (2013.01); *H01L 27/11807* (2013.01); *H01L 29/0692* (2013.01); *H01L 29/1095* (2013.01); *H01L 29/66545* (2013.01)

(58) Field of Classification Search
CPC ......... H01L 27/0207; H01L 21/823892; H01L 27/11807; H01L 29/0692; H01L 29/66545
See application file for complete search history.

(56) References Cited

U.S. PATENT DOCUMENTS

| | | | | | |
|---|---|---|---|---|---|
| 5,679,967 | A | * | 10/1997 | Janai | H01L 21/84 257/209 |
| 5,990,502 | A | * | 11/1999 | Park | H01L 23/528 257/202 |
| 6,756,612 | B1 | * | 6/2004 | Nemati | H01L 27/0817 257/133 |
| 6,831,346 | B1 | * | 12/2004 | Li | H01L 21/761 257/499 |
| 7,250,660 | B1 | * | 7/2007 | Huang | H01L 27/0266 257/173 |
| 7,404,154 | B1 | * | 7/2008 | Venkatraman | H01L 27/0207 326/103 |
| 7,468,617 | B1 | * | 12/2008 | Sengupta | H01L 27/0266 326/82 |
| 7,746,696 | B1 | * | 6/2010 | Paak | G11C 11/41 365/185.05 |
| 7,808,047 | B1 | * | 10/2010 | Gallerano | H01L 27/0277 257/355 |

(Continued)

*Primary Examiner* — Ngan Ngo (57) ABSTRACT

In one embodiment, an integrated circuit includes an array of active structures, an array of dummy structures and multiple well-tap structures. The array of dummy structures surrounds the array of active structures. The well-tap structures may be interposed between the array of active structures and the array of dummy structures. In one embodiment, each of the well-tap structures may include a well, a diffusion region and a gate-like structure. The well may be formed in a substrate and is of a first doping type. The diffusion region may be formed in the well and is also of the first doping type. The gate-like structure may be formed above the substrate and adjacent to the diffusion region.

20 Claims, 6 Drawing Sheets

(56) References Cited

U.S. PATENT DOCUMENTS

| | | | |
|---|---|---|---|
| 7,932,563 B2 | 4/2011 | Ho et al. | |
| 8,217,464 B2 | 7/2012 | Do et al. | |
| 8,314,635 B2 | 11/2012 | Law et al. | |
| 8,472,227 B2 | 6/2013 | Liaw | |
| 8,836,408 B1 * | 9/2014 | den Besten | H03K 17/04163 327/310 |
| 8,952,424 B2 | 2/2015 | Herberholz | |
| 2003/0107069 A1 * | 6/2003 | Takao | H01L 27/11 257/296 |
| 2005/0044522 A1 * | 2/2005 | Maeda | G06F 17/5068 716/53 |
| 2006/0033163 A1 * | 2/2006 | Chen | H01L 27/0277 257/355 |
| 2007/0168899 A1 * | 7/2007 | Frenkil | G06F 17/5068 257/773 |
| 2007/0253257 A1 * | 11/2007 | Wang | H01L 27/115 365/185.29 |
| 2009/0026573 A1 * | 1/2009 | Oh | H01L 27/11568 257/508 |
| 2009/0085068 A1 * | 4/2009 | Furukawa | H01L 27/0928 257/207 |
| 2009/0091973 A1 * | 4/2009 | Sarin | G11C 16/3427 365/185.02 |
| 2011/0171794 A1 * | 7/2011 | Seo | H01L 21/823814 438/231 |
| 2011/0233624 A1 * | 9/2011 | Fujishiro | H01L 29/0847 257/288 |
| 2011/0233687 A1 * | 9/2011 | Shima | H01L 21/823412 257/402 |
| 2011/0305084 A1 * | 12/2011 | Park | H01L 27/11519 365/185.08 |
| 2011/0317467 A1 * | 12/2011 | Nagayama | G11C 17/16 365/94 |
| 2013/0089978 A1 * | 4/2013 | Noel | H01L 21/768 438/622 |
| 2014/0346603 A1 | 11/2014 | Toh et al. | |
| 2014/0367791 A1 * | 12/2014 | Katakami | H01L 27/092 257/369 |
| 2015/0187431 A1 * | 7/2015 | Chung | G11C 17/165 365/96 |
| 2015/0228649 A1 * | 8/2015 | Singh | H01L 27/0886 257/401 |
| 2015/0294732 A1 * | 10/2015 | Chung | G11C 11/1659 365/96 |
| 2016/0026207 A1 * | 1/2016 | Boling | G05F 3/205 327/537 |
| 2016/0049190 A1 * | 2/2016 | Han | G11C 11/4076 365/51 |
| 2016/0254445 A1 * | 9/2016 | Tahmasebi | H01L 27/228 |
| 2016/0276407 A1 * | 9/2016 | Naik | H01L 27/228 |
| 2016/0276580 A1 * | 9/2016 | Tahmasebi | H01L 43/10 |
| 2016/0284720 A1 * | 9/2016 | Ema | H01L 27/11568 |
| 2016/0284763 A1 * | 9/2016 | Tahmasebi | H01L 27/228 |

* cited by examiner

WELL-TAP STRUCTURES FOR ANALOG MATCHING TRANSISTOR ARRAYS

BACKGROUND

Generally, an integrated circuit device such as a programmable logic device (PLD) may include digital and analog circuits. Examples of analog circuits include transceiver circuitry, voltage supply circuitry, filter circuitry, and mirroring circuits. Examples of digital circuits include programmable logic circuits and memory circuits.

A high-precision current mirror circuit, which generates an electrical current that is equal to a reference electrical current, may require matched active structures (e.g., transistor structures). Using a large number of dummy arrays may help to reduce manufacturing variations between the active structures so that a high-precision current mirror circuit may be formed. However, having a high number of dummy arrays may not be compatible with the latch-up rule (a design-for-manufacturing (DFM) requirement) for the active structures in the semiconductor circuit. The latch-up rule requires a well-tap structure to be formed within a relatively short distance (i.e., within 30 microns) from the active structures.

Although there are solutions to form a high-precision current mirror circuit such as placing well-tap structures between every two rows/columns of the active structures in the analog circuits, such solutions may generally increase the overall size of the integrated circuit and as such, are not preferable.

SUMMARY

Embodiments described herein relate to well-tap structures within an integrated circuit. It should be appreciated that the embodiments can be implemented in numerous ways, such as a process, an apparatus, a system, a device, or a method. Several embodiments are described below.

In one embodiment, an integrated circuit includes an array of active structures, an array of dummy structures, and multiple well-tap structures. The array of dummy structures may surround the array of active structures. The well-tap structures may be interposed between the array of active structures and the array of dummy structures. Each of the well-tap structures may include a well, a diffusion region, and a gate-like structure. The well may be formed in a substrate and is of a first doping type. The diffusion region may be formed in the well and is also of the first doping type. The gate-like structure may be formed above the substrate and adjacent to the diffusion region.

Further features of the invention, its nature and various advantages will be more apparent from the accompanying drawings and the following detailed description of the preferred embodiments.

DETAILED DESCRIPTION

The following embodiments describe a well-tap structure within an integrated circuit. It will be obvious, to one skilled in the art, that the present exemplary embodiments may be practiced without some or all of these specific details. In other instances, well-known operations have not been described in detail in order not to unnecessarily obscure the present embodiments.

Figure 1:
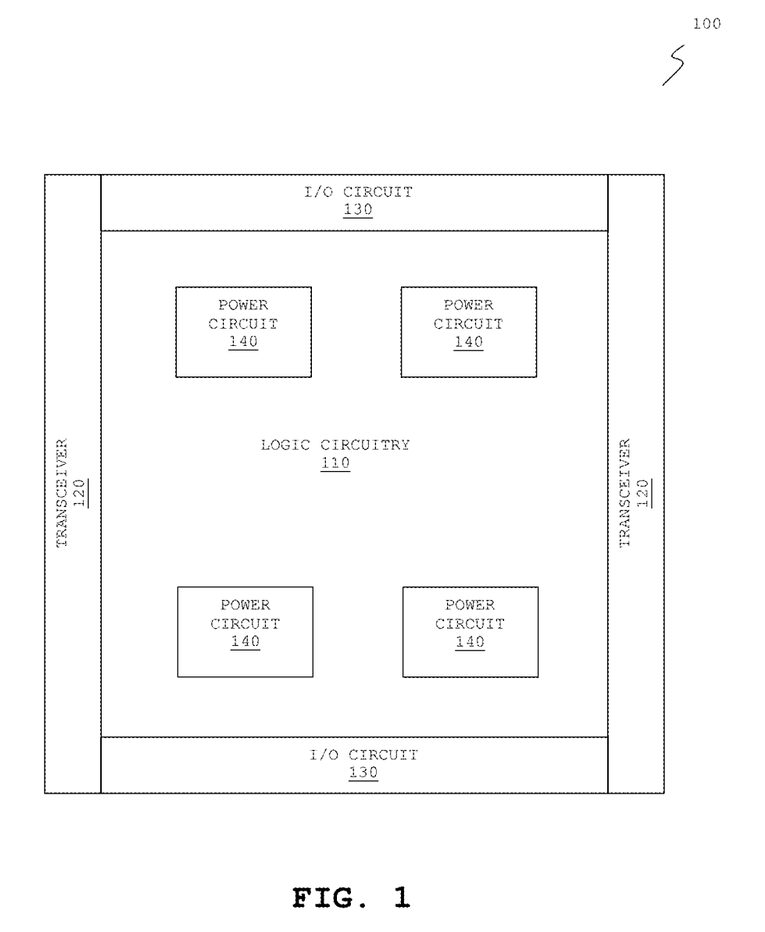
FIG. 1 shows an illustrative integrated circuit in accordance with one embodiment of present invention.

FIG. 1, meant to be illustrative and not limiting, illustrates an integrated circuit in accordance with one embodiment of present invention. Integrated circuit device 100 includes logic circuitry 110, transceivers 120, input/output (I/O) circuits 130 and power circuits 140.

In one embodiment, integrated circuit device 100 may be an application specific integrated circuit (ASIC) device, an application standard specific product (ASSP) device, a programmable logic device (PLD) or a microprocessor device. In general, ASIC and ASSP devices may perform fixed and dedicated functions. PLD devices may be programmable to perform a variety of functions. An example of a PLD device may be a field programmable gate array (FPGA) device. Microprocessor devices, coupled together with other devices (e.g., a memory device), may be utilized to perform instructions provided by programming code.

Integrated circuit device 100 may be used in different types of communication systems, such as wireless systems, wired systems, etc. In one embodiment, integrated circuit device 100 may be a PLD that is utilized for controlling data transfer between different devices, for example, microprocessor devices and memory devices. Hence, integrated circuit device 100 may include circuits that may be used to implement various transmission standards that allow integrated circuit device 100 to communicate with external devices such as memory devices (not shown) that may be coupled to integrated circuit device 100.

Referring still to FIG. 1, transceivers 120 and I/O circuits 130 may occupy the peripheral region of integrated circuit device 100, whereas logic circuitry 110 and power circuits 140 may occupy the center region of integrated circuit device 100. As shown in the embodiment of FIG. 1, four power circuits 140 may be utilized to supply voltages to four different quadrants of logic circuitry 110. It should be appreciated that the arrangement of transceiver 120, I/O circuitry 130, power circuits 140 and logic circuitry 110 on integrated circuit device 100 may vary depending on the requirements of a particular device.

It should be appreciated that logic circuitry 110 may be utilized for performing core functions of integrated circuit device 100. Therefore, logic circuitry 110 may include specific circuitry for the functions that define integrated circuit device 100. For example, logic circuitry 110 may include circuits that perform memory device addressing and processing of information retrieved from a memory device when integrated circuit device 100 is used as a memory controller. In another example, logic circuitry 110 may include programmable logic elements when integrated circuit device 100 is a PLD. The programmable logic elements may further include circuits such as look-up table circuitry, multiplexers, product-term logic, registers, memory and the like. The programmable logic elements may be programmed by a user (e.g., a designer or an engineer) to perform any desired function. It should be appreciated that logic circuitry 110 may mainly include digital circuits (e.g., logic gates, registers, etc.).

Transceivers 120 and I/O circuits 130 may be utilized for transferring signals in or out of integrated circuit device 100. For example, signals from logic circuitry 110 may be transferred out of integrated circuit device 100 through one of the transceivers 120 or I/O circuits 130. Additionally, signals received from an external device (external to integrated circuit device 100) may be transferred to logic circuitry 110 through one of the transceivers 120 or I/O circuits 130. In one embodiment, both transceivers 120 and I/O circuits 130 may be considered as external interfacing circuitry of integrated circuit device 100. Signals may accordingly be transferred out or received by one of the transceivers 120 and I/O circuits 130 through its signal pin (not shown). Each transceiver 120 may include a transmitter circuit and a receiver circuit. Alternatively, each I/O circuit 130 may include only an input circuit or an output circuit.

Power circuits 140 may be utilized to maintain a constant voltage supply within integrated circuit device 100. In one embodiment, power circuits 140 may include voltage regulator circuits that may provide constant voltage signals to the respective circuits within integrated circuit device 100. As shown in the embodiment of FIG. 1, the four power circuits 140 may supply voltage signals to four different quadrants of logic circuitry 110. Each power circuit 140 may also supply the voltage signal to the respective transistor structures and well-tap structures (not shown in FIG. 1) formed within logic circuitry 110, transceiver 120 and I/O circuits 130.

Transceivers 120, I/O circuits 130 and power circuits 140 may include analog circuits (e.g., current mirror circuits, amplifier circuits, etc.). The analog circuits within transceivers 120, I/O circuit 130 and power circuits 140 may include matched active circuits (e.g., circuits including matching transistors). These circuits may also be required to satisfy latch-up rules. The latch-up rules may vary depending on the type of semiconductor process that is being utilized. In one embodiment, the latch-up rules may require a well-tap structure to be formed within a relatively short distance (e.g., 30 microns (μm)) from an active structure that forms any one of transceivers 120, I/O circuits 130 or power circuits 140.

Figure 2:
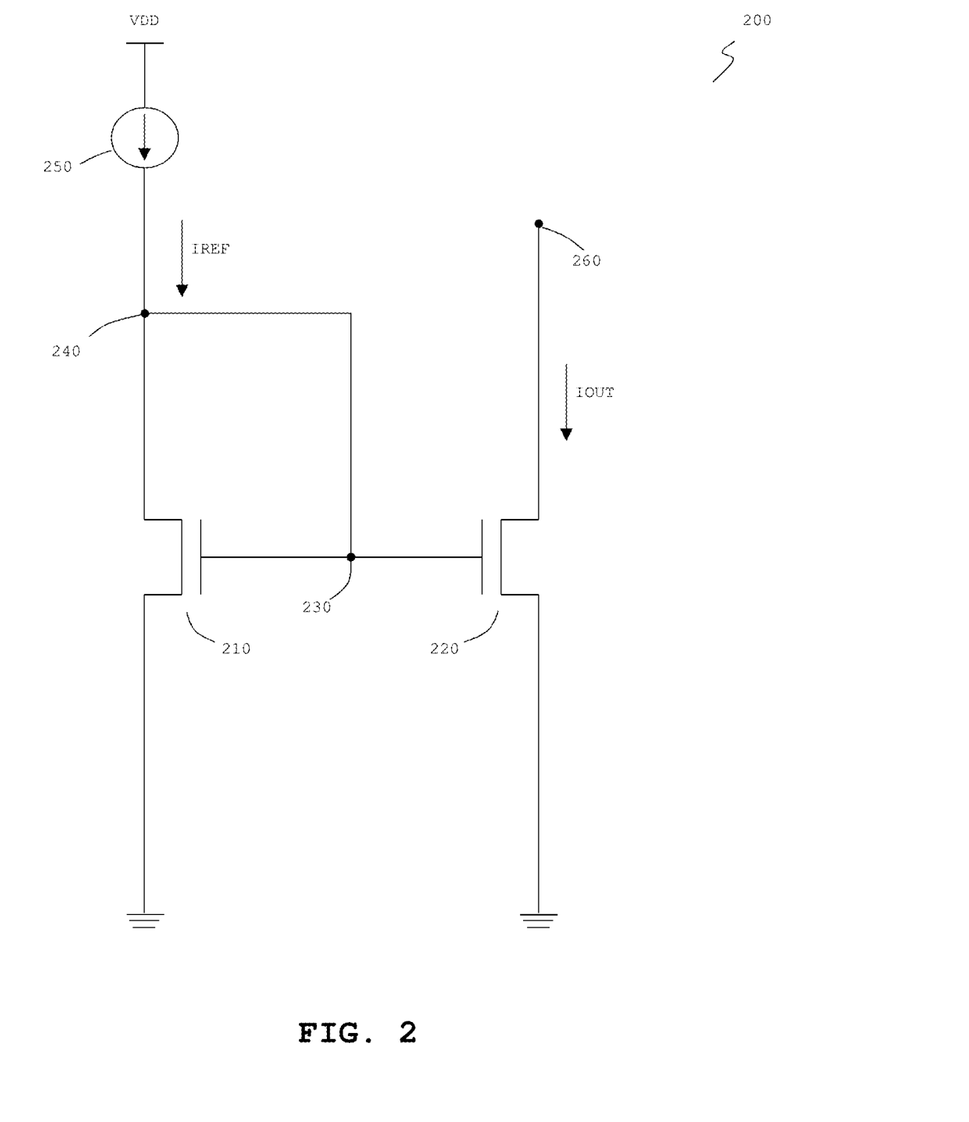
FIG. 2 shows an illustrative current mirror circuit in accordance with one embodiment of the present invention.

FIG. 2, meant to be illustrative and not limiting, illustrates a current mirror circuit in accordance with one embodiment of the present invention. Current mirror circuit 200 may include two transistors 210 and 220. Each of the transistors 210 and 220 may include a gate terminal and two source-drain terminals. As shown in the embodiment of FIG. 2, the gate terminals of both transistors 210 and 220 are coupled together at terminal 230. Terminal 230 is further coupled to terminal 240. The respective source-drain terminals of transistor 210 are coupled to terminal 240 and a ground terminal. The respective source-drain terminals of transistor 220 are coupled to output terminal 260 and a ground terminal. Terminal 240 is coupled current source 250, which is also coupled to a power terminal (VDD).

Current mirror circuit 200 may be utilized to copy electric current from one branch (which may include terminal 240 and transistor 210) to another branch (which may include transistor 220). As shown in the embodiment of FIG. 2, the electric current that is being copied may be referred to as a reference electrical current (IREF) and the electrical current that is generated may be referred to as an output electrical current (IOUT). It should be appreciated that current mirror circuit 200 may fix the output electrical current to the value of the reference electrical current regardless of the loading that is coupled to the branch that transmits IOUT.

It should be appreciated that there are multiple topologies for current mirror circuit 200. In one exemplary embodiment, current mirror circuit 200 may be a Widlar current mirror circuit. Alternatively, current mirror circuit 200 may be a Wilson current mirror circuit. Each topology may provide different basic characteristics (e.g., output impedance, bandwidth, etc.).

Transistors 210 and 220 may be formed using multiple smaller-sized transistors. Transistors 210 and 220 has to be identical in terms of their physical dimensions (i.e., width, length and height) and doping concentration levels in order to generate a high-precision current mirror circuit (i.e., IOUT=IREF). Therefore, the smaller-sized transistors that collectively formed transistors 210 and 220 may need to be identical to each other. In one embodiment, the identical smaller-sized transistors may be formed when a layout as shown in embodiment of FIG. 3 (described below) is utilized. The transistors 210 and 220 may also satisfy the DFM requirement (e.g., the latch-up rules).

Transistors 210 and 220 may be complementary metal oxide semiconductor (CMOS) transistors. In the embodiment of FIG. 2, both transistors 220 and 221 are N-type metal oxide semiconductor (NMOS) transistors. Alternatively, both transistors 210 and 220 may be P-type metal oxide semiconductor (PMOS) transistors.

Figure 3:
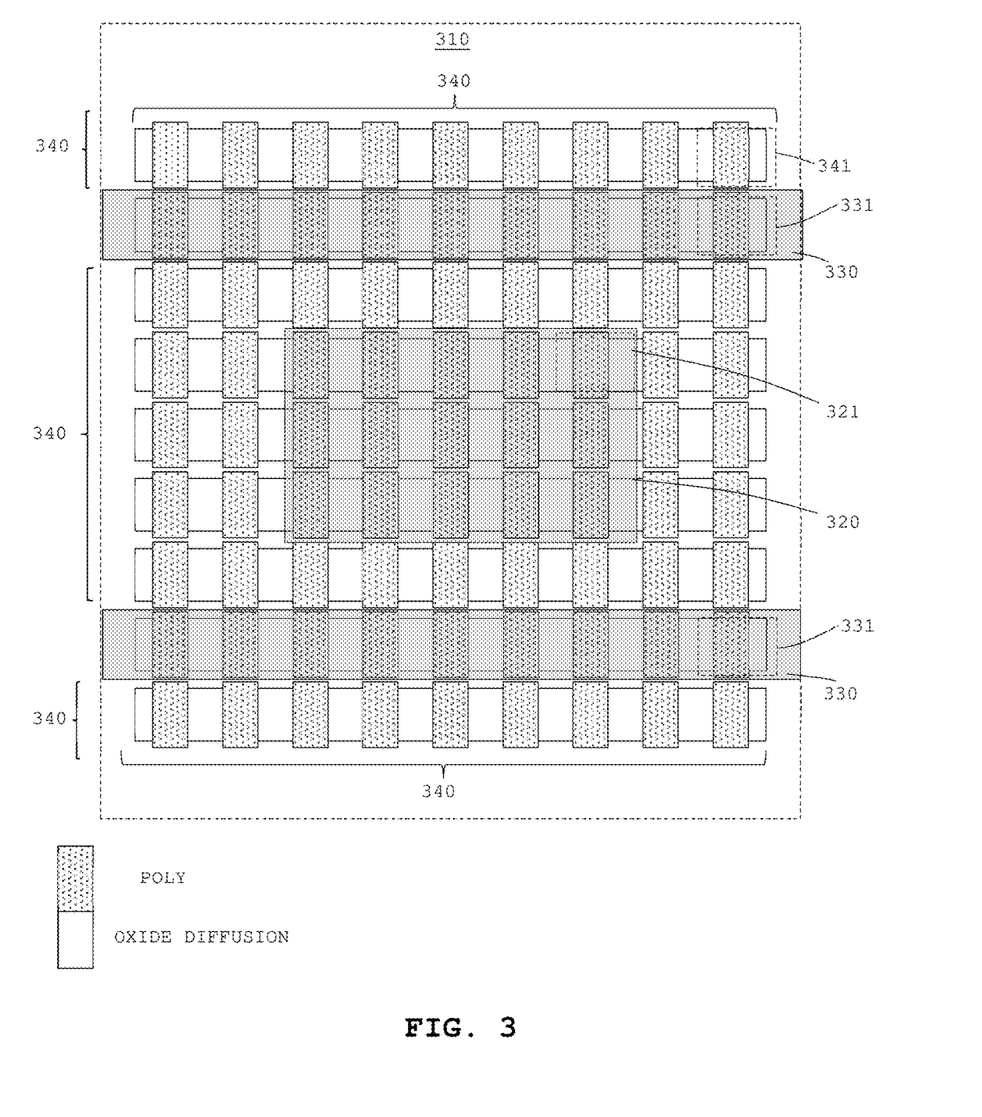
FIG. 3 shows a top layout view of an illustrative analog circuit in accordance with one embodiment of the present invention.

FIG. 3, meant to be illustrative and not limiting, illustrates a layout for the current mirror circuit 200 of the type shown in FIG. 2 in accordance with one embodiment of the present invention. In one embodiment, circuit 310 may be a current mirror circuit (e.g., current mirror circuit 200 of FIG. 2). Circuit 310 may be formed within transceiver 120, I/O circuit 130 or power circuit 140. Circuit 310 may be formed on a semiconductor substrate (e.g., a silicon substrate).

Circuit 310 may include active region 320, dummy region 340 and well-tap rows 330. In FIG. 3, active region 320 may be formed at the center region of circuit 310. Dummy region 340 may be formed immediately adjacent to the edges of active region 320. Two well-tap rows 330 may be formed within dummy region 340.

As shown in the embodiment of FIG. 3, active region 320 may include active structures 321, dummy region 340 may include dummy structures 341, and well-tap rows 330 may include well-tap structures 331. In one embodiment, active structures 321 may be functional transistor structures (e.g., NMOS transistors or PMOS transistors). Active structures 321 may collectively form transistors 210 and 220 of FIG. 2, in one embodiment. Each active structure 321 includes a polycrystalline (POLY) structure and two oxide diffusion (OD) regions, which are located on each side of the polycrystalline structure. In one embodiment, the polycrystalline structure and the oxide diffusion regions may be also referred to as a gate structure and diffusion regions, respectively.

In FIG. 3, active region 320 may have five active structures 321 in each of the three rows. In one embodiment, the length, width and height of each polycrystalline structure within active region 320 may be identical. Similarly, the length and width of each oxide diffusion region within active structures 321 may be identical. Such structures (with identical lengths and widths) may form matching transistors 210 and 220 of FIG. 2.

Dummy structures 341 may be formed for the purpose of design-for-manufacturing. In one embodiment, dummy structures 341 may reduce the impact of undesired manufacturing process variations (e.g., variations in the process of manufacturing the polycrystalline structures or the oxide diffusion regions). Reduced manufacturing process variations may help to form identical active structures 321. Therefore, a large array of dummy structures 341 may couple active structures 321, as shown in the embodiment of FIG. 3. As shown in FIG. 3, a column in the array may include at least one active transistor 321, at least one dummy transistor 341, and at least one well-tap structure 331. In the particular arrangement of FIG. 3, the well-tap structure 331 may be interposed between the active transistor and the dummy transistor along the same column.

In one embodiment, dummy region 340 encompasses a width of at least 50 micrometers away from an edge of active region 320. It should be appreciated that dummy structures 341 may be dummy transistors when active structures 321 are transistor structures. Similar to active structures 321, dummy structures 341 may be formed using the oxide diffusion regions and the polycrystalline structures. The size of the polycrystalline structure and the oxide diffusion regions that form each dummy structure 341 may be identical to that of the polycrystalline structure and oxide diffusion regions that form each active structure 321 and may therefore sometimes be referred to as non-functional transistor structures.

Well-tap structures 331 may be needed to provide a substrate voltage for active structures 321. Well-tap structures 331 may be utilized to prevent a latch-up for analog circuit 310. Latch-up occurs when there is an inadvertent creation of a short circuit between the power supply rails of an active structure 321, which results in a large amount of current to flow through a parasitic structure which disrupts proper functioning of the part, and can oftentimes permanently damage the active structures and any surrounding circuitry. According to a particular wafer fabrication semiconductor design rule, well-tap region 330 has to be placed less than 30 micrometers from the center of active region 320. In one embodiment, a well-tap structure (e.g., well-tap structure 331) may be interposed between an active region (e.g., active region 320) and a dummy region (e.g., dummy region 340). Well-tap structures 331 may be N-type well-tap structures (as shown in FIG. 4) or P-type well-tap structures (as shown in FIG. 5).

Similar to active structures 321 and dummy structures 341, well-tap structures may be formed using the oxide diffusion regions and the polycrystalline structures. In addition to that, the size of the polycrystalline structure and the oxide diffusion regions that form each well-tap structure 331 may be identical to that of the polycrystalline structure and oxide diffusion regions that form each active structure 321 or each dummy structure 341.

As shown in the embodiment of FIG. 3, well-tap structures 331 are placed within a selected area of dummy region 340. Hence, the embodiment of FIG. 4 does not take up a large area of the integrated circuit.

Figure 4:
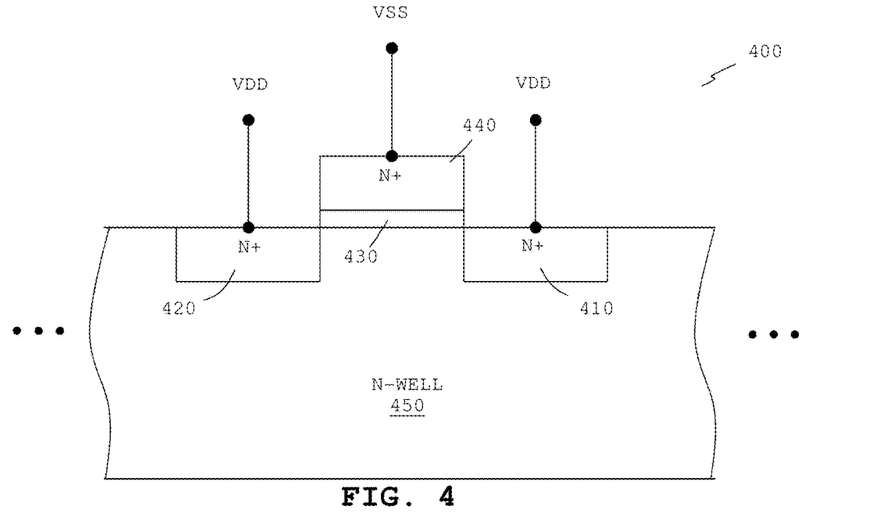
FIG. 4 is a cross-sectional side view of an illustrative N-type well-tap structure in accordance with one embodiment of the present invention.
Figure 5:
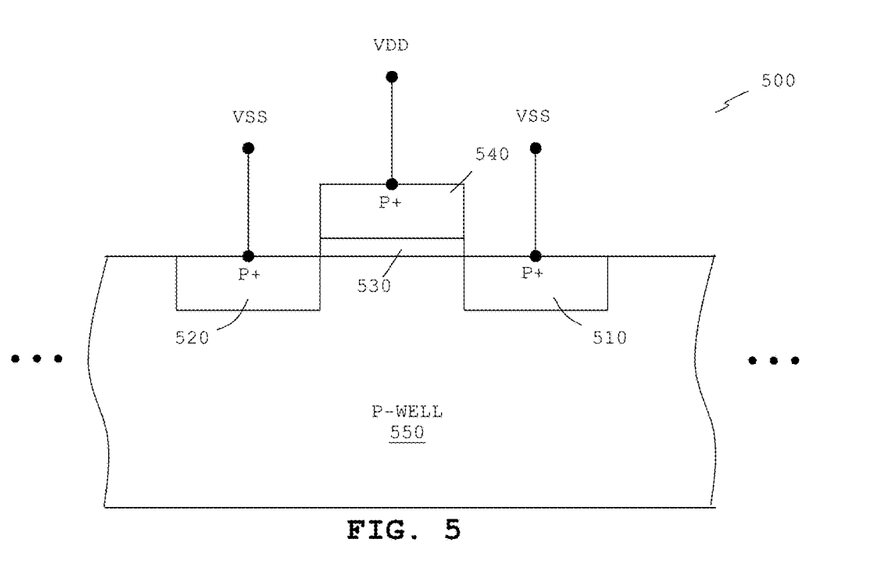
FIG. 5 is a cross-sectional side view of an illustrative P-type well-tap structure in accordance with one embodiment of the present invention.

FIG. 4, meant to be illustrative and not limiting, illustrates an N-type well-tap structure in accordance with one embodiment of the present invention. In one embodiment, N-type well-tap structure 400 may be a detailed implementation of well-tap structure 331 of FIG. 3. N-type well-tap structure 400 includes N-well 450, two N+ type diffusion regions 410 and 420, oxide layer 430 and polycrystalline structure 440.

In one embodiment, N-well 450 may be formed on a P-type substrate (not shown). The two N+ type diffusion regions 410 and 420 are formed within N-well 450. However, the N+ type diffusion regions 410 and 420 may have a higher doping concentration than N-well 450. Each N+ type diffusion region may be coupled to a voltage supply source (VDD). Polycrystalline structure 440 is formed above N-well 450 and on top of oxide layer 430. As shown in the embodiment of FIG. 4, polycrystalline structure 440 is coupled to a ground voltage (VSS). Well-tap structure 400 having polycrystalline structure 440 that is coupled to ground (VSS) and the two N+ type diffusion regions 410 and 420 coupled to VDD may form a power supply decoupling capacitor between the ground terminal (VSS) and a power terminal (VDD). Alternatively, polycrystalline structure 440 may be coupled to a power terminal (VDD), similar to N+ type diffusion regions 410 and 420. However, polycrystalline structure 440 tied to the power terminal may not form the power supply decoupling capacitor.

FIG. 5, meant to be illustrative and not limiting, illustrates a P-type well-tap structure in accordance with one embodiment of the present invention. In one embodiment, P-type well-tap structure 500 may be a detailed implementation of well-tap structure 331 of FIG. 3. P-type well-tap structure 500 includes P-well 550, two P+ type diffusion regions 510 and 520, oxide layer 530 and polycrystalline structure 540.

In one embodiment, P-well 550 may be formed on an N-type substrate. The two P+ type diffusion regions 510 and 520 are formed within P-well 550. However, the P+ type diffusion regions 510 and 520 may have a higher doping concentration than P-well 550. Each P+ type diffusion region may be coupled to a ground source (VSS). Polycrystalline structure 540 is formed above P-well 550 and on top of oxide layer 530. As shown in the embodiment of FIG. 5, polycrystalline structure 540 is coupled to a power source (VDD). Polycrystalline structure 540 that is coupled to a power source (VDD) and formed on top of P-well 550 may form a power supply decoupling capacitor between the ground source (VSS) and a power source (VDD). Alternatively, polycrystalline structure 540 may be coupled to a ground source (VSS), similar to P+ type diffusion regions 510 and 520. However, polycrystalline structure 540 tied to a ground source may not form the power supply decoupling capacitor.

Figure 6:
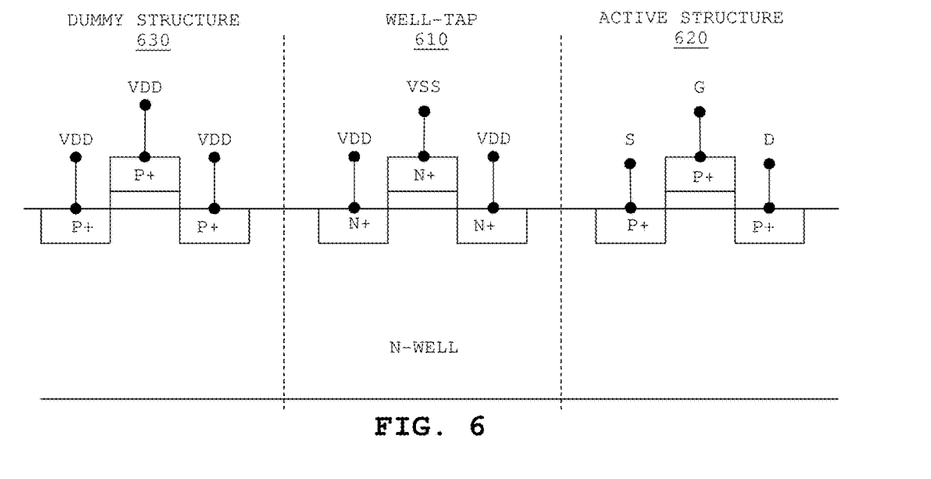
FIG. 6 shows an illustrative cross-sectional view of three different types of structures including an active p-channel transistor in accordance with one embodiment of the present invention.

FIG. 6, meant to be illustrative and not limiting, illustrates a cross section of three different types of structures in accordance with one embodiment of the present invention. The three structures include well-tap structure 610, active structure 620 and dummy structure 630. In one embodiment, well-tap structure 610, active structure 620 and dummy structure 630 may be similar to well-tap structure 331, active structure 321 and dummy structure 341, respectively, of FIG. 3. The three structures are formed on an N-well substrate. The N-well substrate may be formed on a P-type substrate (not shown). In one embodiment, lengths and widths of the three structures may be identical, and therefore may be utilized to form a high precision current mirror circuit (e.g., current mirror circuit 200 of FIG. 2).

As shown in the embodiment of FIG. 6, active structure 620 is a PMOS transistor. The PMOS transistor includes two diffusion regions, which form the respective source-drain terminals of the PMOS transistor, and a polycrystalline structure that forms a gate terminal. The diffusion regions may have a high doping concentration of P-type dopants (as reflected by P+). In one embodiment, and similar to active structure 321 of FIG. 3, active structure 620 may form a part of transistor 210 or 220 of FIG. 2.

Well-tap structure 610 is an N-type well-tap structure. Similar to active structure 620, well-tap structure 610 includes two diffusion regions and a polycrystalline structure. The two diffusion regions include a high concentration of N-type dopants (as reflected by N+). The polycrystalline structure is also doped with a high concentration of N-type dopants. As shown in the embodiment of FIG. 6, the two diffusion regions are coupled to a power source in order to receive a VDD voltage signal whereas the polycrystalline structure is coupled to a ground source in order to receive a VSS voltage signal. It should be appreciated that an N-type well-tap structure is needed for a PMOS transistor structure.

Dummy structure 630 may be similar to well-tap structure 610. However, as shown in the embodiment of FIG. 6, the two diffusion regions and the polycrystalline structure are coupled to a power source that transmits a VDD signal. Dummy structures 630, similar to dummy structures 341 of FIG. 3, may be formed for the purpose of design-for-manufacturing (e.g., to reduce the impact of undesired manufacturing process variations).

Figure 7:
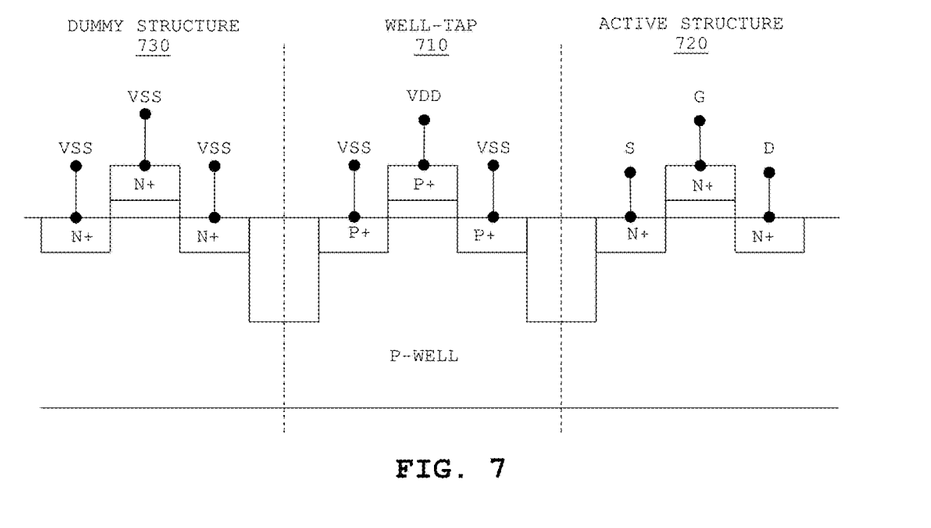
FIG. 7 shows another illustrative cross-sectional view of three different types of structures including an active n-channel transistor in accordance with one embodiment of the present invention.

FIG. 7, meant to be illustrative and not limiting, illustrates another cross section of three different types of structures in accordance with one embodiment of the present invention. The three structures include well-tap structure 710, active structure 720 and dummy structure 730. The structures are formed on a P-well substrate. In one embodiment, well-tap structure 710, active structure 720 and dummy structure 730 may be similar to well-tap structure 331, active structure 321 and dummy structure 341, respectively, of FIG. 3. The P-well substrate may be formed on an N-type substrate (not shown). As described above with reference to the embodiment of FIG. 6, the lengths and widths of the three structures may be identical, and therefore may be utilized to form a high precision current mirror circuit (e.g., current mirror circuit 200 of FIG. 2).

As shown in the embodiment of FIG. 7, active structure 720 is an NMOS transistor. The NMOS transistor includes two diffusion regions that form the respective source-drain terminals of the transistor and a polycrystalline structure that forms the gate terminal. The diffusion regions may include a high concentration of N-type dopants (as reflected by N+). In one embodiment, active structure 720 may be utilized to form a part of transistor 210 or 220 of FIG. 2.

Well-tap structure 710 is a P-type well-tap structure. Similar to active structure 720, well-tap structure 710 includes two diffusion regions and a polycrystalline structure. The two diffusion regions include a high concentration of P-type dopants (as reflected by P+). The polycrystalline structure is also doped with a high concentration of P-type dopants. As shown in the embodiment of FIG. 7, the two diffusion regions are coupled to a ground source to receive a VSS voltage level signal whereas the polycrystalline structure is coupled to a power source to receive a VDD voltage level signal.

Dummy structure 730 may be similar to active structure 710. However, as shown in the embodiment of FIG. 7, the two diffusion regions and the polycrystalline structure may be tied to a ground source that transmits a VSS voltage level signal.

Figure 8:
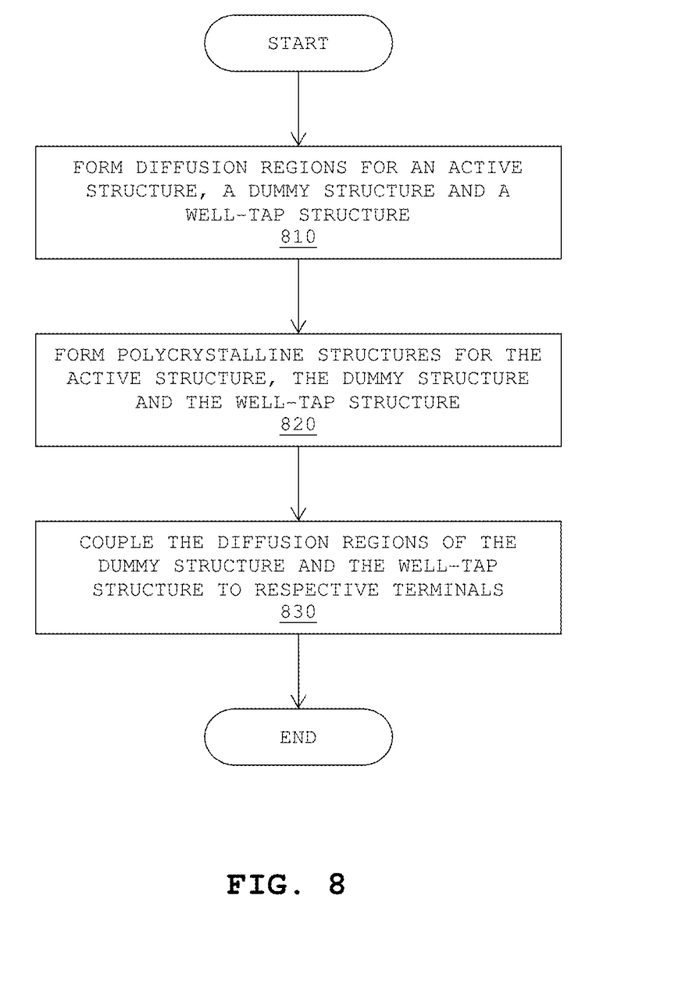
FIG. 8 shows a flowchart of illustrative steps for manufacturing an analog circuit in accordance with one embodiment of the present invention.

FIG. 8, meant to be illustrative and not limiting, illustrate a method of manufacturing an analog circuit in accordance with one embodiment of the present invention. The analog circuit may be similar to analog circuit 310 of FIG. 3. In one embodiment, the analog circuit may be a high precision current mirror circuit (e.g., current mirror circuit 200 of FIG. 2) that includes at least two transistors (e.g., transistor 210 and 220 of FIG. 2). The analog circuit may be manufactured on a semiconductor substrate (e.g., silicon substrate). In one embodiment, the substrate may be a P-type silicon substrate. Alternatively, the substrate may be an N-type silicon substrate.

At step 810, diffusion regions for active structures, dummy structures and well-tap structures are formed. In one exemplary embodiment, when the active structure is a PMOS transistor, the diffusion regions for the active structures, the dummy structures and the well-tap structures may be similar to the P+ type diffusion regions for active structure 620, the P+ type diffusion regions for dummy structure 630 and the N+ type diffusion regions for well-tap structure 610, respectively, of FIG. 6. Alternatively, when the active structure is an NMOS transistor, the diffusion regions for the active structures, the dummy structures and the well-tap structures may be similar to the N+ type diffusion regions for active structure 720, the N+ type diffusion regions for dummy structure 730 and the P+ type diffusion regions for well-tap structure 710, respectively, of FIG. 7. The diffusion regions for the active structures, dummy structures and well-tap structures may have identical width and length dimensions.

At step 820, polycrystalline structures for the active structures, the dummy structures and the well-tap structures are formed. When the active structures include PMOS transistors, the polycrystalline structures for the active structures, the dummy structures and the well-tap structures may be similar to the P+ polycrystalline structure for active structure 620, the P+ polycrystalline structure for dummy structure 630 and the N+ polycrystalline structure for well-tap structure 610, respectively, of FIG. 6. However, when the active structures include NMOS transistors, the polycrystalline structures for the active structures, the dummy structures and the well-tap structures may be similar to the N+ polycrystalline structure for active structure 720, the N+ polycrystalline structure for dummy structure 730 and the P+ polycrystalline structure for well-tap structure 710, respectively, of FIG. 7. The polycrystalline structures for the active structures, the dummy structures and the well-tap structures may also have identical widths and lengths.

At step 830, the diffusion regions for the active structures, the dummy structures and the well-tap are coupled to their respective terminals. For example, when the active structure is a PMOS transistor, the diffusion regions for the active structure may be coupled terminals that transmit signals (e.g., similar to the diffusion regions for active structure 620 of FIG. 6 coupled to the source-drain terminals) and the diffusion regions for the dummy structures and the well-tap structures may be coupled to a VDD voltage terminal (e.g., similar to the diffusion regions for dummy structure 630 and well-tap structure 610 of FIG. 6 that are coupled to the VDD voltage level). Alternatively, when the active structure is an NMOS transistor, the diffusion regions for the active structure may be coupled to terminals that transmit signals (e.g., similar to the diffusion regions for active structure 720 of FIG. 7 coupled to the source-drain terminals) and the diffusion regions for the dummy structures and well-tap structures may be coupled to a VSS voltage level (e.g., similar to the diffusion regions for dummy structure 730 and well-tap structure 710 of FIG. 7 that is coupled to a VSS voltage level).

In addition to that, the polycrystalline structures for the active structures, the dummy structures and the well-tap may also be coupled to their respective voltage terminals. For example, the polycrystalline structure for the active structure may be coupled to a terminal that transmits a control signal, whereas the polycrystalline structures for the dummy structure and the well-tap structure may be coupled to a VDD voltage level and a VSS voltage level, respectively (as shown by dummy structure 630 and well-tap structure 610 of FIG. 6). Alternatively, the polycrystalline structures for the dummy structure and the well-tap structure may be coupled to a VSS voltage level and a VDD voltage level, respectively (as shown by dummy structure 730 and well-tap structure 710 of FIG. 7).

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:
1. A well-tap structure, comprising:
a well of a first doping type;
a diffusion region of the first doping type formed in the well; and
a gate-like structure formed directly above a portion of the well, wherein the diffusion region is formed directly adjacent to the portion of the well.

2. The well-tap structure as defined in claim 1, further comprising:
an additional diffusion region of the first doping type formed directly adjacent to the the portion of the well, wherein the portion of the well is interposed between the diffusion region and the additional diffusion region.

3. The well-tap structure as defined in claim 1, wherein the diffusion region has a doping concentration, and wherein the well has a doping concentration that is less than the doping concentration of the diffusion region.

4. The well-tap structure as defined in claim 1, wherein the well comprises a p-well.

5. The well-tap structure as defined in claim 4, wherein the diffusion region is coupled to a ground power supply voltage terminal.

6. The well-tap structure as defined in claim 5, wherein the gate-like structure is coupled to a positive power supply voltage terminal.

7. The well-tap structure as defined in claim 1, wherein the well comprises an n-well.

8. The well-tap structure as defined in claim 7, wherein the diffusion region is coupled to a positive power supply voltage terminal.

9. The well-tap structure as defined in claim 8, wherein the gate-like structure is coupled to a ground power supply voltage terminal.

10. An integrated circuit, comprising:
an array of active structures;
an array of dummy structures that surrounds the array of active structures; and
a plurality of well-tap structures interposed between the array of active structures and the array of dummy structures, wherein each well-tap structure in the plurality of well-tap structures includes an associated gate-like conductor.

11. The integrated circuit as defined in claim 10, wherein the active structure is a functional transistor structure, and wherein the dummy structure is a non-functional transistor structure.

12. The integrated circuit as defined in claim 10, wherein the active structures within the array of active structures comprise matching transistor structures.

13. The integrated circuit as defined in claim 10, wherein the associated gate-like structure for each of the well-tap structures is formed adjacent to a well-tap contact of the well-tap structure.

14. The integrated circuit as defined in claim 13, wherein a distance between the plurality of well-tap structures and a center of the array of active structures is less than 30 microns.

15. The integrated circuit as defined in claim 13, wherein the array of dummy structures surrounds the array of active structures to at least 50 microns from the center of the array of active structures.

16. An integrated circuit device, comprising:
an array of transistor structures, wherein a column in the array of transistor structures comprises:
at least one active transistor;
at least one dummy transistor; and
a well-tap structure interposed between the active transistor and the dummy transistor in the column.

17. The integrated circuit device as defined in claim 16, wherein diffusion regions for the active transistor, the dummy transistor, and the well-tap structure have same width and length.

18. The integrated circuit device as defined in claim 16, wherein the well-tap structure has an associated gate-like structure formed over a semiconductor substrate.

19. The integrated circuit device as defined in claim 18, wherein the gate-like structure forms part of a decoupling capacitor.

20. The integrated circuit as defined in claim 10, wherein each well-tap structure in the plurality of well-tap structures further includes a diffusion region of a given doping type that is formed in a well of the given doping type.

* * * * *